(12) United States Patent
Cho et al.

(10) Patent No.: US 7,852,123 B1
(45) Date of Patent: Dec. 14, 2010

(54) RESET-FREE COMPARATOR WITH BUILT-IN REFERENCE

(75) Inventors: Thomas B. Cho, Fremont, CA (US); Dong Chen, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 284 days.

(21) Appl. No.: 11/482,888

(22) Filed: Jul. 7, 2006

(51) Int. Cl.
*H03K 5/153* (2006.01)
(52) U.S. Cl. .............................. 327/74; 327/65; 327/563
(58) Field of Classification Search .................... 327/63, 327/65, 74, 77, 307, 563
See application file for complete search history.

(56) References Cited

U.S. PATENT DOCUMENTS

| | | | | |
|---|---|---|---|---|
| 5,001,484 A | * | 3/1991 | Weiss | 341/153 |
| 5,268,872 A | * | 12/1993 | Fujii et al. | 365/189.07 |
| 5,424,663 A | * | 6/1995 | Wong | 327/65 |
| 5,994,959 A | * | 11/1999 | Ainsworth | 330/252 |
| 6,686,794 B1 | * | 2/2004 | Abidin et al. | 327/537 |
| 7,102,545 B2 | * | 9/2006 | Choi | 327/74 |
| 7,187,214 B2 | * | 3/2007 | Kim et al. | 327/77 |
| 2007/0216468 A1 | * | 9/2007 | Duarte | 327/513 |

* cited by examiner

*Primary Examiner*—Long Nguyen (57) ABSTRACT

A comparator circuit includes a bias stage, a first current source, a second current source, and a comparator stage. The bias stage includes a first input, a second input, an output that generates a bias voltage, and a first load, wherein differential reference voltages are applied to the first and second inputs. The first current source generates a bias current based on the bias voltage and inputs the bias current to the bias stage. The second current source generates the bias current based on the bias voltage. The comparator stage communicates with the second current source and includes a first input, a second input, and a second load, wherein differential input voltages are applied to the first and second inputs of the comparator stage. The comparator circuit compares the differential input voltages to the differential reference voltages based on the bias current, the first load, and the second load.

45 Claims, 7 Drawing Sheets

RESET-FREE COMPARATOR WITH BUILT-IN REFERENCE

FIELD

The present disclosure relates to amplifier circuits.

BACKGROUND

The background description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present disclosure.

Figure 1A:
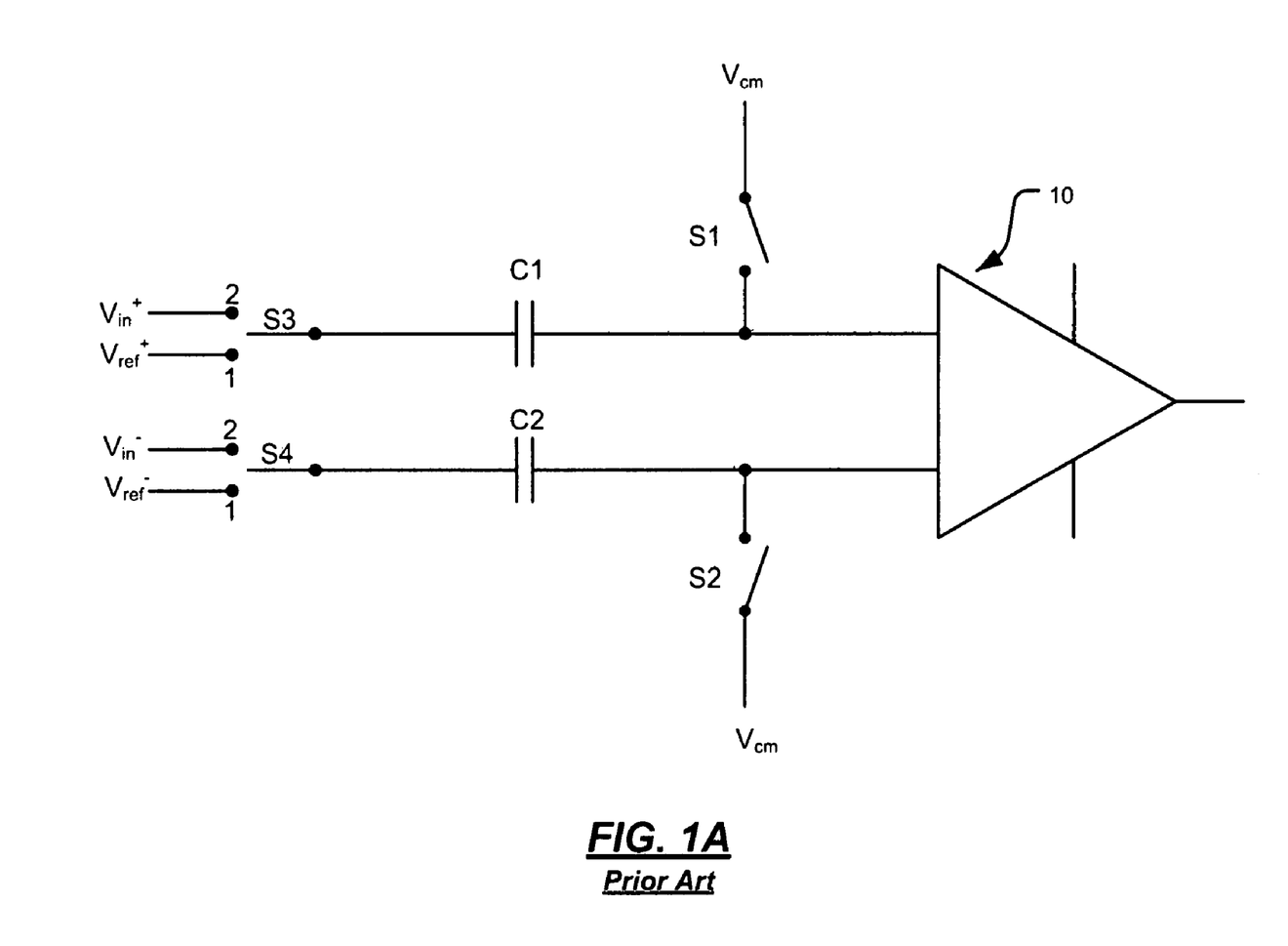
FIG. 1A shows a schematic of an exemplary comparator according to the prior art.

A comparator circuit compares an input to a reference. Referring now to FIG. 1A, a differential comparator 10 compares input voltages $V_{in}^+$ and $V_{in}^-$ to reference voltages $V_{ref}^+$ and $V_{ref}^-$ respectively. A timing circuit (not shown) controls switches S1, S2, S3, and S4. With switches S1 and S2 closed and switches S3 and S4 in position 1, capacitors C1 and C2 are first charged to reference voltages $V_{ref}^+$ and $V_{ref}^-$, respectively. Thereafter, with switches S1 and S2 open and switches S3 and S4 in position 2, the differential comparator 10 compares input voltages $V_{in}^+$ and $V_{in}^-$ to reference voltages $V_{ref}^+$ and $V_{ref}^-$, respectively.

Figure 1B:
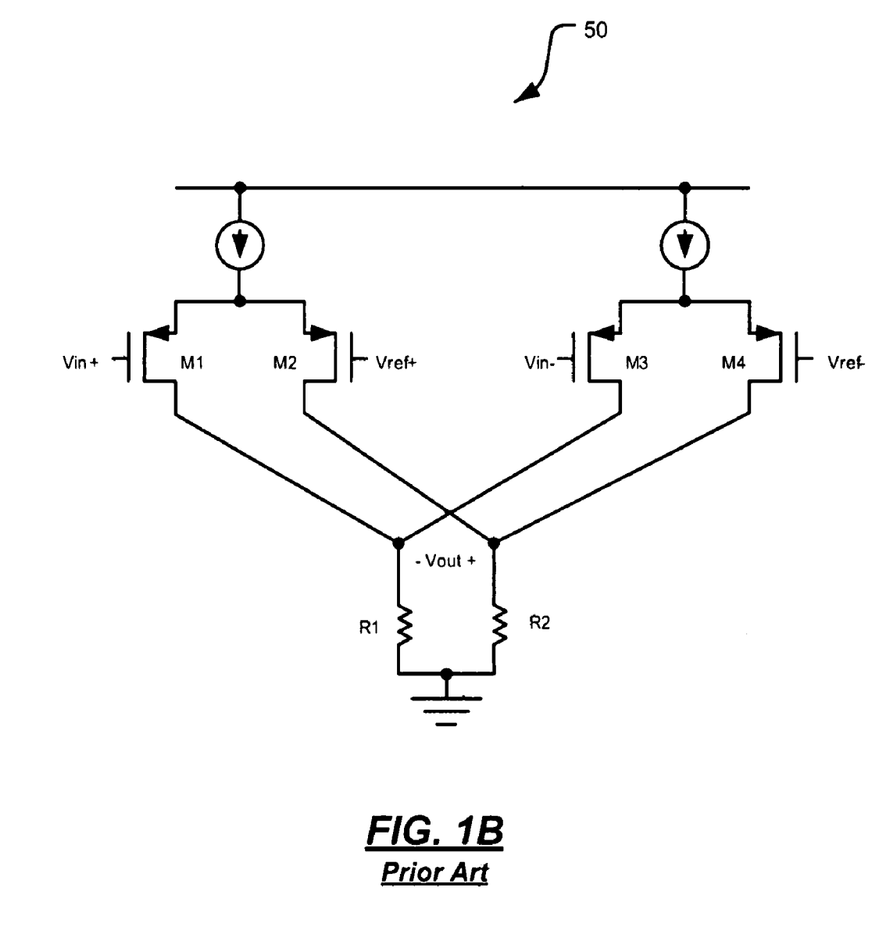
FIG. 1B shows a schematic of an exemplary comparator according to the prior art.

Referring now to FIG. 1B, a differential difference comparator 50 converts a difference between ($V_{in}^+$ and $V_{ref}^+$) and a difference between ($V_{in}^-$ and $V_{ref}^-$) into currents. The comparator 50 generates an output based on a difference between voltages across resistors R1 and R2 generated by the currents. Comparator 50, however, is sensitive to a difference between input and reference common-mode voltages. Input common-mode voltage is defined as $V_{incm}=(V_{in}^+ + V_{in}^-)/2$, and reference common-mode voltage is defined as $V_{refcm}=(V_{ref}^+ + V_{ref}^-)/2$. Thus, comparator 50 may not function properly unless common-mode voltages are regulated.

SUMMARY

A comparator circuit comprises a bias stage having a first input, a second input, an output that generates a bias voltage, and a first load, wherein differential reference voltages are applied to the first input and the second input. The comparator circuit comprises a first current source that generates a bias current based on the bias voltage and that inputs the bias current to the bias stage and a second current source that communicates with the bias stage and that generates the bias current based on the bias voltage. The comparator circuit comprises a comparator stage that communicates with the second current source and that has a first input, a second input, and a second load, wherein differential input voltages are applied to the first input and the second input of the comparator stage. The comparator circuit compares the differential input voltages to the differential reference voltages based on the bias current, the first load, and the second load.

In another feature, the first load includes a first resistance and the second load includes a second resistance, wherein the first resistance is substantially equal to the second resistance.

In another feature, a threshold voltage for the comparator stage is substantially equal to a threshold voltage for the bias stage.

In another feature, the first current source comprises a transistor having a first terminal, a control terminal that communicates with the output of the bias stage, and a second terminal that communicates with the first load.

In another feature, the second current source comprises a transistor having a first terminal, a control terminal that communicates with the output of the bias stage, and a second terminal that communicates with the second load.

In another feature, the bias stage further comprises an operational amplifier (op-amp) having a first input, a second input, and an output that communicates with the output of the bias stage.

In another feature, the comparator circuit further comprises a first transistor having a control terminal that communicates with the first input of the bias stage, a first terminal that communicates with the first current source, and a second terminal that communicates with the first input of the op-amp and a first resistance. The comparator circuit further comprises a second transistor having a first terminal that communicates with the first load, a control terminal that communicates with the second input of the bias stage, and a second terminal that communicates with the second input of the op-amp and a second resistance. The first resistance is substantially equal to the second resistance.

In another feature, the comparator stage further comprises a first transistor having a control terminal that communicates with the first input of the comparator stage, a first terminal that communicates with the second current source, and a second terminal that communicates with a first resistance. The comparator stage further comprises a second transistor having a first terminal that communicates with the second load, a control terminal that communicates with the second input of the comparator stage, and a second terminal that communicates with a second resistance. The first resistance is substantially equal to the second resistance.

In another feature, resistances in the bias stage are substantially equal to resistances in the comparator stage.

In another feature, the bias current that is input to the bias stage is scaled relative to the bias current that is input to the comparator stage based on resistance values of the first load and the second load.

In another feature, a built-in reference for the comparator circuit is generated based on the bias current and the first load.

A comparator circuit comprises bias means for biasing and having a first input, a second input, an output that generates a bias voltage, and a first load, wherein differential reference voltages are applied to the first input and the second input. The comparator circuit comprises first current means for generating a bias current based on the bias voltage and that inputs the bias current to the bias stage and second current means that communicates with the bias stage and for generating the bias current based on the bias voltage. The comparator circuit comprises comparator means for comparing that communicates with the second current source and that has a first input, a second input, and a second load, wherein differential input voltages are applied to the first input and the second input of the comparator means. The comparator means compares the differential input voltages to the differential reference voltages based on the bias current, the first load, and the second load.

In another feature, the first load includes first resistance means for providing resistance and the second load includes second resistance means for providing resistance, wherein the first resistance means is substantially equal to the second resistance means.

In another feature, a threshold voltage for the comparator means is substantially equal to a threshold voltage for the bias means.

In another feature, the first current means comprises a transistor having a first terminal, a control terminal that communicates with the output of the bias stage, and a second terminal that communicates with the first load.

In another feature, the second current means comprises a transistor having a first terminal, a control terminal that communicates with the output of the bias stage, and a second terminal that communicates with the second load.

In another feature, the bias means further comprises amplifier means for amplifying having a first input, a second input, and an output that communicates with the output of the bias means.

In another feature, the comparator circuit further comprises a first transistor having a control terminal that communicates with the first input of the bias means, a first terminal that communicates with the first current means, and a second terminal that communicates with the first input of the amplifying means and first resistance means for providing resistance. The comparator means further comprises a second transistor having a first terminal that communicates with the first load, a control terminal that communicates with the second input of the bias stage, and a second terminal that communicates with the second input of the amplifying means and second resistance means. The first resistance means is substantially equal to the second resistance means.

In another feature, the comparator stage further comprises a first transistor having a control terminal that communicates with the first input of the comparator means, a first terminal that communicates with the second current means, and a second terminal that communicates with first resistance means for providing resistance. The comparator means further comprises a second transistor having a first terminal that communicates with the second load, a control terminal that communicates with the second input of the comparator means, and a second terminal that communicates with second resistance for providing resistance. The first resistance means is substantially equal to the second resistance means.

In another feature, resistances in the bias stage are substantially equal to resistances in the comparator stage.

In another feature, the bias current that is input to the bias means is scaled relative to the bias current that is input to the comparator means based on resistance values of the first load and the second load.

In another feature, a built-in reference for the comparator means is generated based on the bias current and the first load.

In still other features, a method comprises applying differential reference voltages to inputs of a bias stage, generating a bias voltage based on the differential reference voltages, generating a bias current based on the bias voltage, supplying the bias current to a first load in the bias stage, supplying the bias current to a second load in a comparator stage, applying differential input voltages to inputs of the comparator stage, and comparing the differential input voltages to the differential reference voltages based on the bias current, the first load, and the second load.

In another feature, the method further comprises substantially equalizing resistance values of the first load and the second load.

In another feature, the method further comprises generating a threshold voltage for the comparator stage that is substantially equal to a threshold voltage for the bias stage.

In another feature, the method further comprises generating the bias current for the bias stage using a first current source, biasing the first current source by the bias voltage, generating the bias current for the comparator stage using a second current source, and biasing the second current source by the bias voltage.

In another feature, the method further comprises generating the bias voltage using an operational amplifier (op-amp).

In another feature, the method further comprises substantially equalizing resistance values of resistances in the bias stage to resistance values of corresponding resistances in the comparator stage.

In another feature, the method further comprises scaling the bias current that is input to the bias stage relative to the bias current that is input to the comparator stage based on resistance values of the first load and the second load.

In another feature, the method further comprises generating a built-in reference based on the bias current and the first load.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 2:
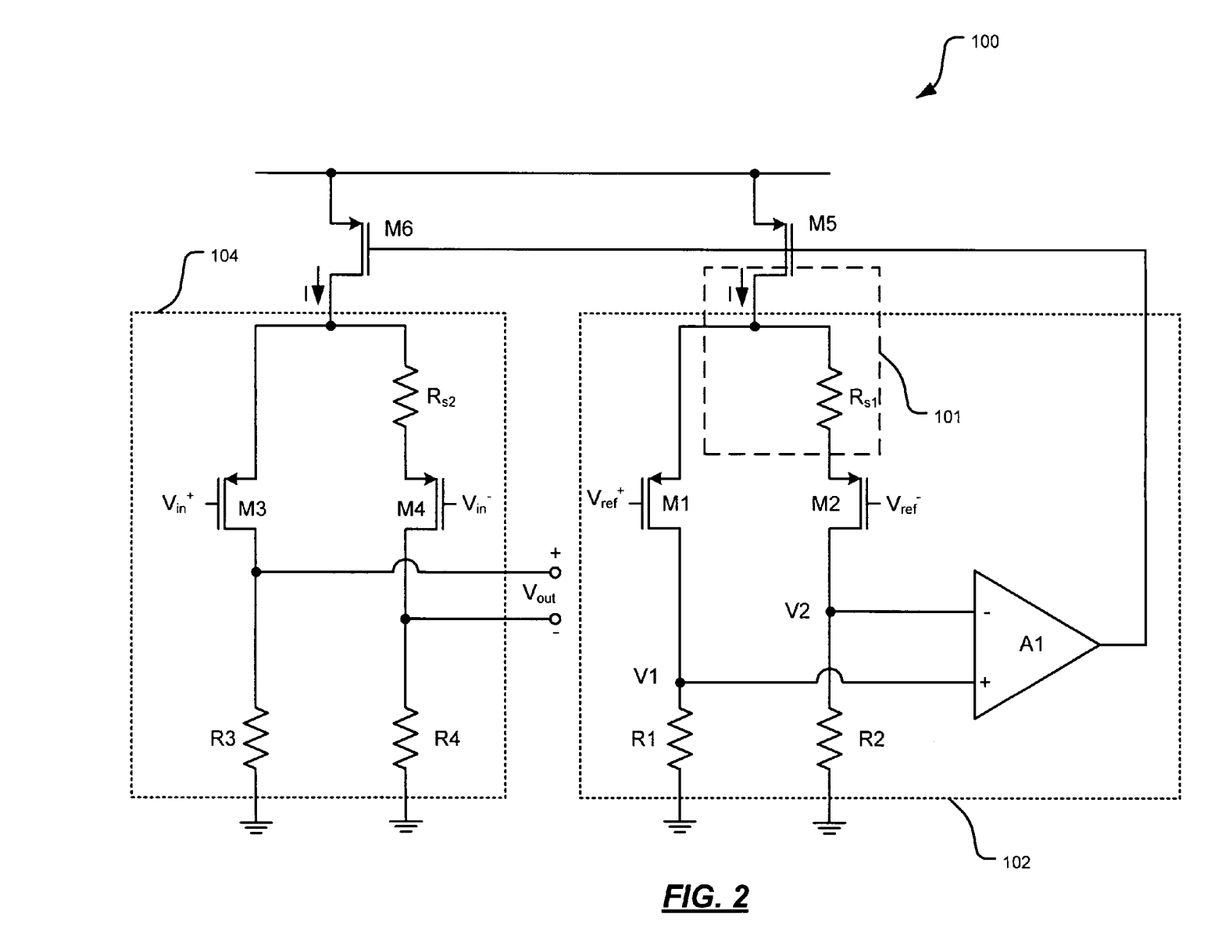
FIG. 2 is an exemplary circuit diagram of a reset-free comparator in built-in reference according to the present disclosure.

Reference voltages $V_{ref}^+$ and $V_{ref}^-$ are applied to transistors M1 and M2, respectively, in the bias stage 102. Input voltages $V_{in}^+$ and $V_{in}^-$ are applied to transistors M3 and M4 in the comparator stage 104. Resistors R1, R2, R3, and R4 may have substantially equal resistance values. That is, R1=R2=R3=R4. Resistors $R_{s1}$ and $R_{s2}$, which may be referred to as first and second loads, respectively, may have substantially equal resistance values. That is, $R_{s1}=R_{s2}$.

The bias stage 102 comprises an operational amplifier (op-amp) A1. Due to high gain of the op-amp A1, voltages V1 and V2 are substantially equal. That is, V1=V2. Op-amp A1 generates a bias voltage that biases transistors M5 and M6. Based on the bias voltage, transistors M5 and M6 generate a bias current I.

The bias current I is input to the bias stage 102 and the comparator stage 104 by transistors M5 and M6, respectively. That is, transistors M5 and M6 effectively mirror the bias current I. A threshold for the bias stage 102 of the comparator 100 is given by the following formula.

$$V_{threshold} = V_{ref}^+ - V_{ref}^-$$

Since $R_{s1}=R_{s2}$ and since the bias current I is substantially equal for the bias stage 102 and the comparator stage 104, $V_{threshold}$ for the comparator stage 104 is substantially the same as $V_{threshold}$ for the bias stage 102.

Thus, by mirroring the bias current I and using resistors $R_{s1}$ and $R_{s2}$ that have substantially equal resistance values, the comparator stage 104 uses the same reference voltages $V_{ref}^+$ and $V_{ref}^-$ that are applied to the bias stage 102 to compare input voltages $V_{in}^+$ and $V_{in}^-$, respectively. Since the built-in reference (i.e., zero-crossover threshold) for the comparator 100 is determined by the bias current I and the resistor $R_{s1}$ instead of common-mode voltage, the comparator 100 is not sensitive to a difference in input and reference common-mode voltages.

The bias current to the bias stage 102 may be scaled relative to the bias current to the comparator stage 104 by varying the resistance values of $R_{s1}$ and $R_{s2}$. For example, the bias current to the stage 102 can be half of the bias current to the comparator stage 104 if $R_{s1}=2 R_{s2}$. Scaling bias current saves power consumed by the comparator 100.

Figure 3A:
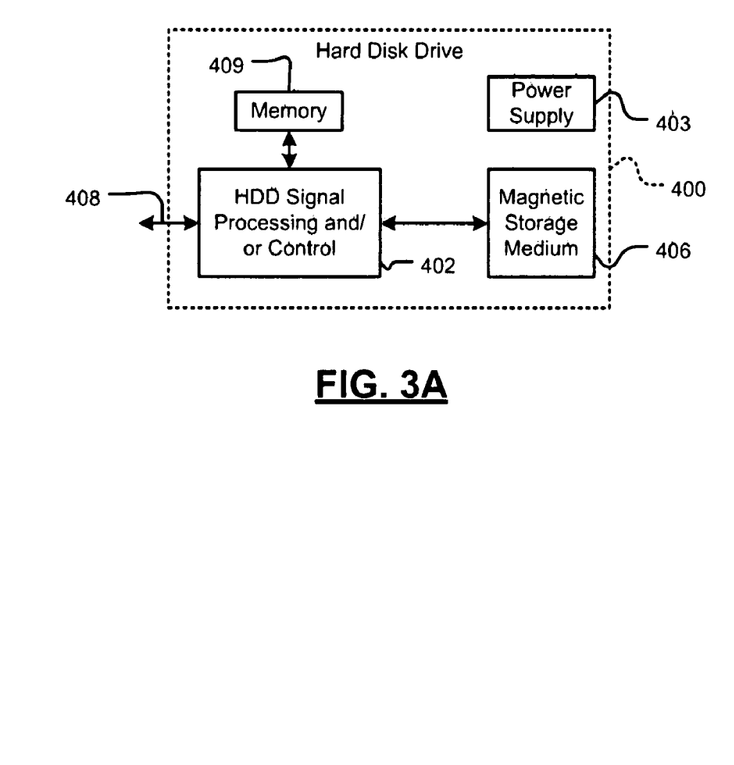
FIG. 3A is a functional block diagram of a hard disk drive.

Referring now to FIGS. 3A-3G, various exemplary implementations of the present disclosure are shown. Referring now to FIG. 3A, the comparator 100 can be implemented in multiple circuits such as amplifiers, D/A converters, A/D converters, power supplies, etc., in a hard disk drive 400. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Figure 3B:
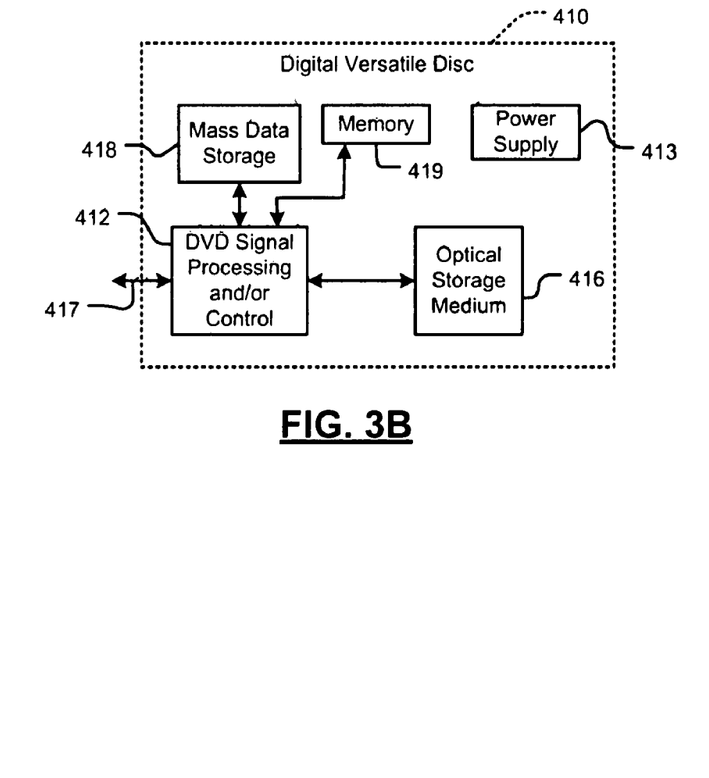
FIG. 3B is a functional block diagram of a digital versatile disk (DVD)

Referring now to FIG. 3B, the comparator 100 can be implemented in multiple circuits such as amplifiers, D/A converters, A/D converters, power supplies, etc., in a digital versatile disc (DVD) drive 410. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 412. The DVD 410 may communicate with mass data storage 418 that stores data in a nonvolatile manner. The mass data storage 418 may include a hard disk drive (HDD). The HDD may have the configuration shown in FIG. 3A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Figure 3C:
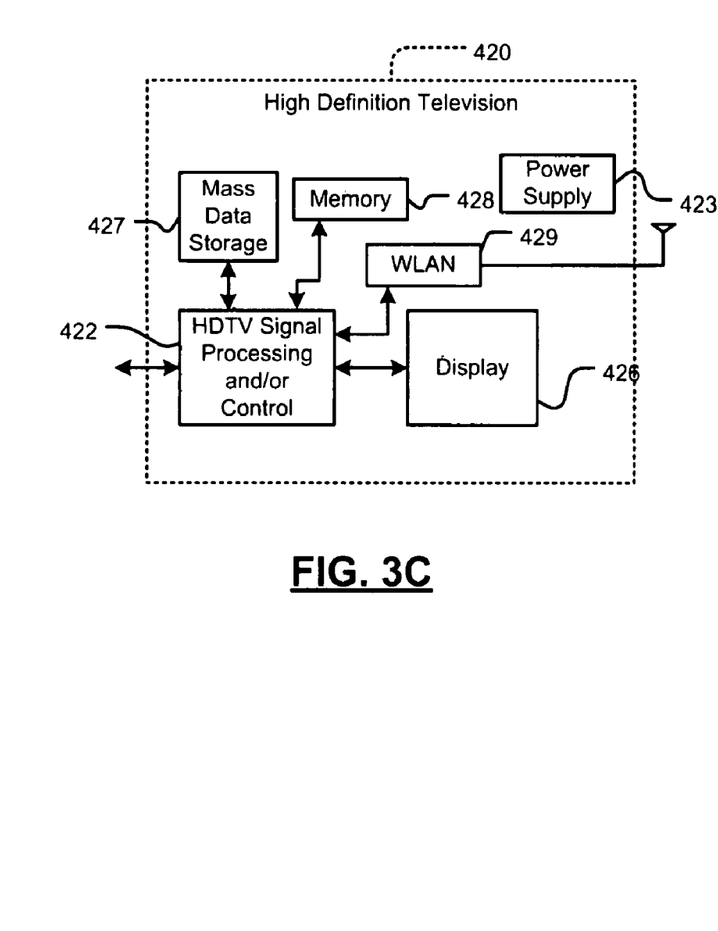
FIG. 3C is a functional block diagram of a high definition television.

Referring now to FIG. 3C, the comparator 100 can be implemented in multiple circuits such as amplifiers, D/A converters, A/D converters, power supplies, etc., in a high definition television (HDTV) 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 3A and/or at least one DVD may have the configuration shown in FIG. 3B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Figure 3D:
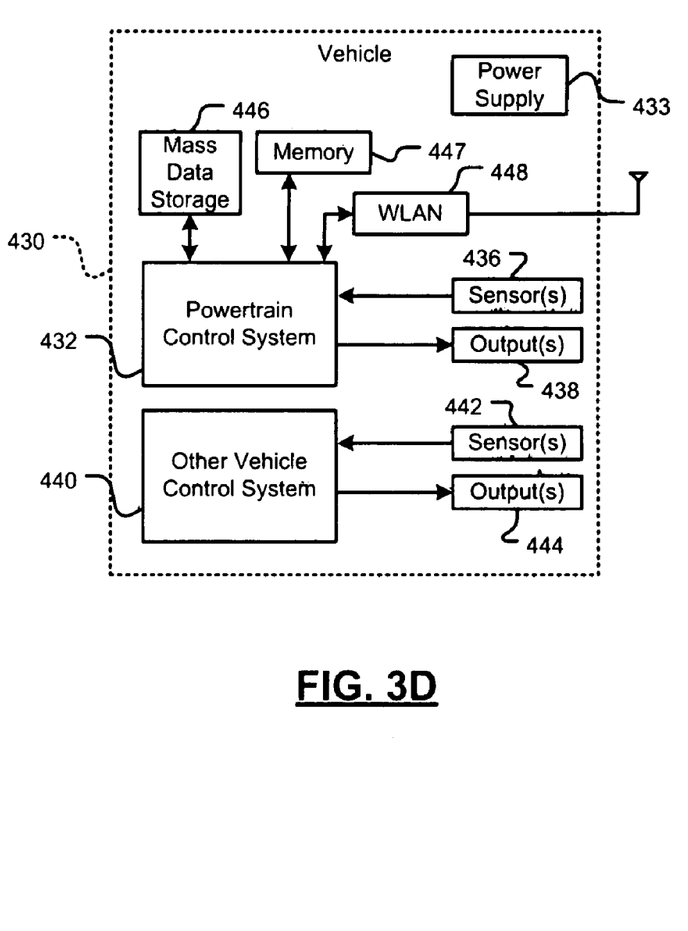
FIG. 3D is a functional block diagram of a vehicle control system.

Referring now to FIG. 3D, the comparator 100 may be implemented in multiple circuits such as amplifiers, D/A converters, A/D converters, power supplies, etc., in a control system of a vehicle 430. The comparator 100 may be implemented in a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The comparator 100 may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 3A and/or at least one DVD may have the configuration shown in FIG. 3B. The HDD may be a mini HDD that includes one or more platters having a diameter that is smaller than approximately 1.8".

The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 3E:
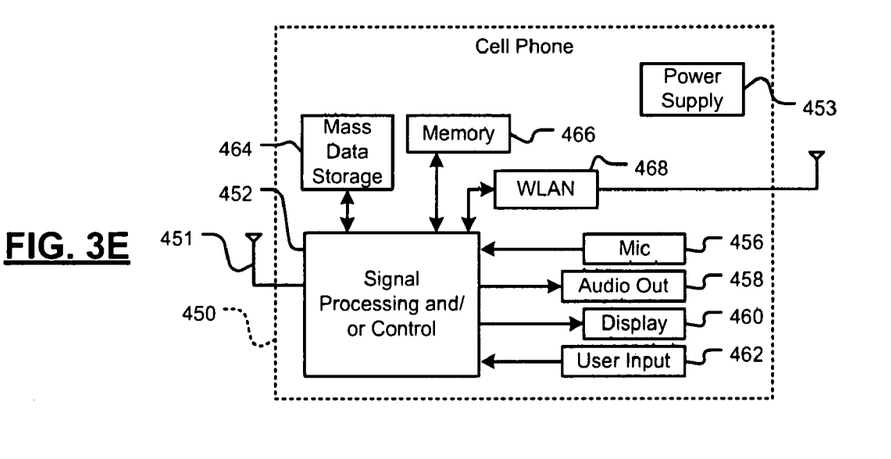
FIG. 3E is a functional block diagram of a cellular phone.

Referring now to FIG. 3E, the comparator 100 can be implemented in multiple circuits such as amplifiers, D/A converters, A/D converters, power supplies, etc., in a cellular phone 450 that may include a cellular antenna 451. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 3A and/or at least one DVD may have the configuration shown in FIG. 3B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 3F:
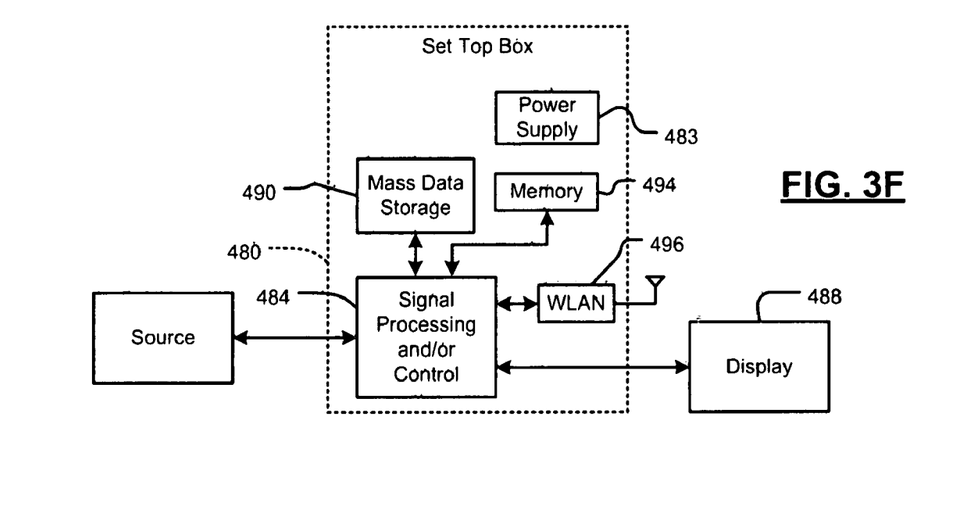
FIG. 3F is a functional block diagram of a set top box.

Referring now to FIG. 3F, the comparator 100 can be implemented in multiple circuits such as amplifiers, D/A converters, A/D converters, power supplies, etc., in a set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 3A and/or at least one DVD may have the configuration shown in FIG. 3B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 3G:
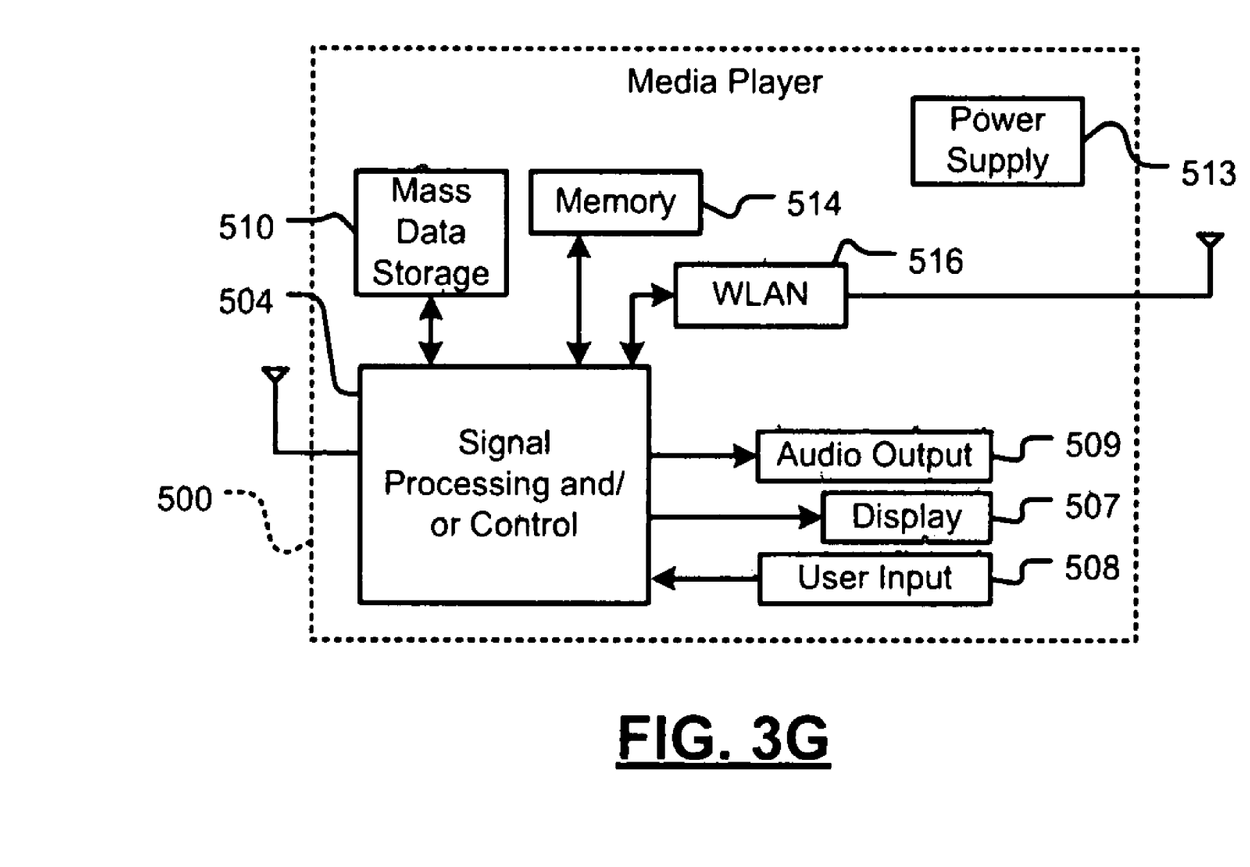
FIG. 3G is a functional block diagram of a media player.

Referring now to FIG. 3G, the comparator 100 can be implemented in multiple circuits such as amplifiers, D/A converters, A/D converters, power supplies, etc., in a media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 3A and/or at least one DVD may have the configuration shown in FIG. 3B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A system comprising:
a bias stage having a first input, a second input, an output that generates a bias voltage based on a difference between said first input and said second input, and a first load, wherein differential reference voltages are applied to said first input and said second input;
a first current source that generates a bias current based on said bias voltage and that inputs said bias current to said bias stage;
a second current source that communicates with said bias stage and that generates said bias current based on said bias voltage; and
a comparator stage that communicates with said second current source and that has a first input, a second input, and a second load, wherein differential input voltages are applied to said first input and said second input of said comparator stage,
wherein the system compares said differential input voltages to said differential reference voltages based on said bias current, said first load, and said second load.

2. The system of claim 1 wherein said first load includes a first resistance and said second load includes a second resistance, wherein said first resistance is substantially equal to said second resistance.

3. The system of claim 1 wherein a threshold voltage for said comparator stage is substantially equal to a threshold voltage for said bias stage.

4. The system of claim 1 wherein said first current source comprises a transistor having a first terminal, a control terminal that communicates with said output of said bias stage, and a second terminal that communicates with said first load.

5. The system of claim 1 wherein said second current source comprises a transistor having a first terminal, a control terminal that communicates with said output of said bias stage, and a second terminal that communicates with said second load.

6. The system of claim 1 wherein said bias stage further comprises an operational amplifier (op-amp) having a first input, a second input, and an output that communicates with said output of said bias stage.

7. The system of claim 6 further comprising:
a first transistor having a control terminal that communicates with said first input of said bias stage, a first terminal that communicates with said first current source, and a second terminal that communicates with said first input of said op-amp and a first resistance; and
a second transistor having a first terminal that communicates with said first load, a control terminal that communicates with said second input of said bias stage, and a second terminal that communicates with said second input of said op-amp and a second resistance.

8. The system of claim 7 wherein said first resistance is substantially equal to said second resistance.

9. The system of claim 1 wherein said comparator stage further comprises:
a first transistor having a control terminal that communicates with said first input of said comparator stage, a first terminal that communicates with said second current source, and a second terminal that communicates with a first resistance; and
a second transistor having a first terminal that communicates with said second load, a control terminal that communicates with said second input of said comparator stage, and a second terminal that communicates with a second resistance.

10. The system of claim 9 wherein said first resistant is substantially equal to said second resistance.

11. The system of claim 1 wherein said bias current that is input to said bias stage is scaled relative to said bias current that is input to said comparator stage based on resistance values of said first load and said second load.

12. The system of claim 1 wherein a built-in reference voltage for said comparator stage is generated based on said bias current and said first load.

13. A method, comprising:
applying differential reference voltages to inputs of a bias stage;
generating a bias voltage based on a difference between said differential reference voltages;
generating a bias current based on said bias voltage;
supplying said bias current to a first load in said bias stage;
supplying said bias current to a second load in a comparator stage;
applying differential input voltages to inputs of said comparator stage; and
comparing said differential input voltages to said differential reference voltages based on said bias current, said first load, and said second load.

14. The method of claim 13 further comprising substantially equalizing resistance values of said first load and said second load.

15. The method of claim 13 further comprising setting a threshold voltage for said comparator stage that is substantially equal to a threshold voltage for said bias stage.

16. The method of claim 13 further comprising:
generating said bias current for said bias stage using a first current source;
biasing said first current source by said bias voltage;
generating said bias current for said comparator stage using a second current source; and
biasing said second current source by said bias voltage.

17. The method of claim 13 further comprising generating said bias voltage using an operational amplifier (op-amp).

18. The method of claim 13 further comprising substantially equalizing resistance values of resistances in said bias stage to resistance values of corresponding resistances in said comparator stage.

19. The method of claim 13 further comprising scaling said bias current that is input to said bias stage relative to said bias current that is input to said comparator stage based on resistance values of said first load and said second load.

20. The method of claim 13 further comprising generating a built-in reference voltage based on said bias current and said first load.

21. A system comprising:
a bias stage having a first input, a second input, an output that generates a bias voltage based on a difference between said first input and said second input, and a first load, wherein differential reference voltages are applied to said first input and said second input;
a first current source that generates a bias current based on said bias voltage and that inputs said bias current to said bias stage;
a second current source that communicates with said bias stage and that generates said bias current based on said bias voltage; and
a comparator stage that communicates with said second current source and that has a first input, a second input, and a second load, wherein differential input voltages are applied to said first input and said second input of said comparator stage,
wherein said comparator stage generates differential output voltages based on said differential input voltages, said differential reference voltages, said bias current, said first load, and said second load.

22. The system of claim 21 wherein said first load includes a first resistance and said second load includes a second resistance, wherein said first resistance is substantially equal to said second resistance.

23. The system of claim 21 wherein a threshold voltage for said comparator stage is substantially equal to a threshold voltage for said bias stage.

24. The system of claim 21 wherein said first current source comprises a transistor having a first terminal, a control terminal that communicates with said output of said bias stage, and a second terminal that communicates with said first load.

25. The system of claim 21 wherein said second current source comprises a transistor having a first terminal, a control terminal that communicates with said output of said bias stage, and a second terminal that communicates with said second load.

26. The system of claim 21 wherein said bias stage further comprises an operational amplifier (op-amp) having a first input, a second input, and an output that communicates with said output of said bias stage.

27. The system of claim 26 further comprising:
a first transistor having a control terminal that communicates with said first input of said bias stage, a first terminal that communicates with said first current source, and a second terminal that communicates with said first input of said op-amp and a first resistance; and
a second transistor having a first terminal that communicates with said first load, a control terminal that communicates with said second input of said bias stage, and a second terminal that communicates with said second input of said op-amp and a second resistance.

28. The system of claim 27 wherein said first resistance is substantially equal to said second resistance.

29. The system of claim 21 wherein said comparator stage further comprises:
- a first transistor having a control terminal that communicates with said first input of said comparator stage, a first terminal that communicates with said second current source, and a second terminal that communicates with a first resistance; and
- a second transistor having a first terminal that communicates with said second load, a control terminal that communicates with said second input of said comparator stage, and a second terminal that communicates with a second resistance.

30. The system of claim 29 wherein said first resistant is substantially equal to said second resistance.

31. The system of claim 21 wherein resistances in said bias stage are substantially equal to resistances in said comparator stage.

32. The system of claim 21 wherein said bias current that is input to said bias stage is scaled relative to said bias current that is input to said comparator stage based on resistance values of said first load and said second load.

33. The system of claim 21 wherein a built-in reference voltage for said comparator stage is generated based on said bias current and said first load.

34. A comparator circuit comprising:
- first and second current sources that generate first and second currents, respectively, wherein said second current is proportional to said first current;
- a first pair of input devices that receives first and second reference signals and that are driven by said first current that is based on a difference between said first and second reference signals, wherein said first pair of input devices communicate in parallel via a first resistance;
- a sub-circuit that drives output terminals of said first pair of input devices to be approximately equal; and
- a second pair of input devices that receives first and second input signals, and that are driven by said second current, and that have output terminals, wherein said second pair of input devices communicate in parallel via a second resistance.

35. The comparator circuit of claim 34 wherein said sub-circuit comprises an operational amplifier having inputs connected to said output terminals of said first pair of input devices.

36. The comparator circuit of claim 35 wherein an output of said operational amplifier controls said first and second current sources.

37. The comparator circuit of claim 35 wherein said first and second current sources comprise field-effect transistors having first terminals, second terminals, and control terminals, wherein said control terminals of said first and second current sources communicate with said output of said operational amplifier.

38. The comparator circuit of claim 34 wherein said first and second pairs of input devices comprise field-effect transistors having first terminals, second terminals, and control terminals.

39. The comparator circuit of claim 38 wherein said first terminal of a first one of said first pair of input devices communicates with said first current source, wherein said first terminal of a second one of said first pair of input devices communicates with said first current source via said first resistance, wherein said first terminal of a first one of said second pair of input devices communicates with said second current source, and wherein said first terminal of a second one of said second pair of input devices communicates with said second current source via said second resistance.

40. The comparator circuit of claim 34 wherein said first and second resistances comprise first and second resistances, respectively.

41. The comparator circuit of claim 40 wherein said first and second currents are approximately equal and resistance values of said first and second resistances are approximately equal.

42. The comparator circuit of claim 41 wherein a first ratio of said first current to said second current is approximately equal to a second ratio of a resistance value of said second resistance to a resistance value of said first resistance.

43. The comparator circuit of claim 34 wherein said first pair of input devices is loaded by first and second loads, respectively, and wherein said second pair of input devices is loaded by third and fourth loads, respectively.

44. The comparator circuit of claim 43 wherein said first, second, third, and fourth loads are functionally equivalent.

45. The comparator circuit of claim 44 wherein said first, second, third, and fourth loads each comprise a resistor having a predetermined resistance value.

* * * * *